(12) United States Patent
Alini et al.

(10) Patent No.: US 8,625,242 B2
(45) Date of Patent: Jan. 7, 2014

(54) FAILSAFE GALVANIC ISOLATION BARRIER

(75) Inventors: Roberto Alini, Dublin, CA (US); Rajesh Kumar Gupta, Sunnyvale, CA (US); Baris Posat, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 94 days.

(21) Appl. No.: 13/197,136

(22) Filed: Aug. 3, 2011

(65) Prior Publication Data
US 2013/0033791 A1 Feb. 7, 2013

(51) Int. Cl.
*H02H 3/20* (2006.01)

(52) U.S. Cl.
USPC .......................................... 361/90

(58) Field of Classification Search
USPC .......................................... 361/90
See application file for complete search history.

(56) References Cited

U.S. PATENT DOCUMENTS

| | | | | | |
|---|---|---|---|---|---|
| 4,616,207 | A | * | 10/1986 | Knapp et al. | 338/32 H |
| 4,636,978 | A | * | 1/1987 | Bellavance et al. | 712/1 |
| 5,059,555 | A | * | 10/1991 | Iranmanesh et al. | 438/328 |
| 5,086,331 | A | * | 2/1992 | Hartgring et al. | 257/529 |
| 5,353,028 | A | * | 10/1994 | de Wit et al. | 341/172 |
| 5,625,218 | A | * | 4/1997 | Yamadera et al. | 257/529 |
| 6,873,065 | B2 | | 3/2005 | Haigh | 307/412 |
| 7,489,526 | B2 | | 2/2009 | Chen | 363/17 |
| 7,548,440 | B2 | | 6/2009 | Chen | 363/98 |
| 7,558,080 | B2 | | 7/2009 | Chen | 363/17 |
| 7,613,016 | B2 | | 11/2009 | Chen | 363/17 |
| 7,706,154 | B2 | | 4/2010 | Chen | 363/17 |
| 2002/0135236 | A1 | * | 9/2002 | Haigh et al. | 307/91 |
| 2004/0095702 | A1 | * | 5/2004 | Ghahary | 361/118 |
| 2005/0269657 | A1 | * | 12/2005 | Dupuis | 257/446 |
| 2010/0052630 | A1 | | 3/2010 | Chen | 323/247 |
| 2010/0073008 | A1 | * | 3/2010 | Twerdochlib | 324/520 |
| 2010/0186994 | A1 | * | 7/2010 | Westmarland et al. | 174/250 |

OTHER PUBLICATIONS

Kugelstadt, Thomas, "New Digital, Capacitive Isolators Raise the Bar in High-Performance" EETimes.com, Apr. 6, 2010, 6 Pages.
US 7,630,213, 12/2009, Chen (withdrawn)

* cited by examiner

*Primary Examiner* — Jared Fureman
*Assistant Examiner* — Kevin J Comber

(57) ABSTRACT

A system includes a transmitter, a receiver, a isolation barrier, and a fuse. The isolation barrier is connected to the transmitter. The fuse is connected between the isolation barrier and the receiver. The isolation barrier prevents current flow from the transmitter to the receiver when a voltage across the isolation barrier is less than a first breakdown voltage. The isolation barrier short circuits when the voltage across the isolation barrier is greater than or equal to the first breakdown voltage. The fuse opens when the isolation barrier short circuits. When open, the fuse has a second breakdown voltage that is greater than the first breakdown voltage.

13 Claims, 6 Drawing Sheets

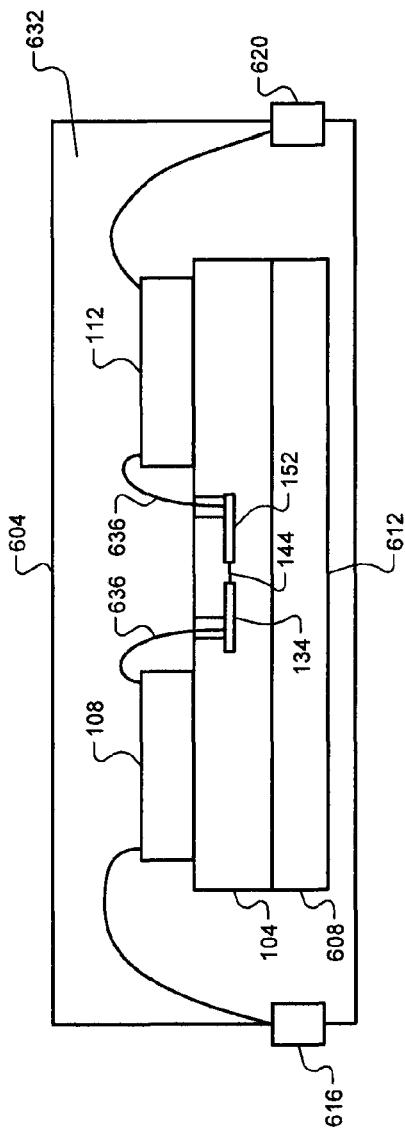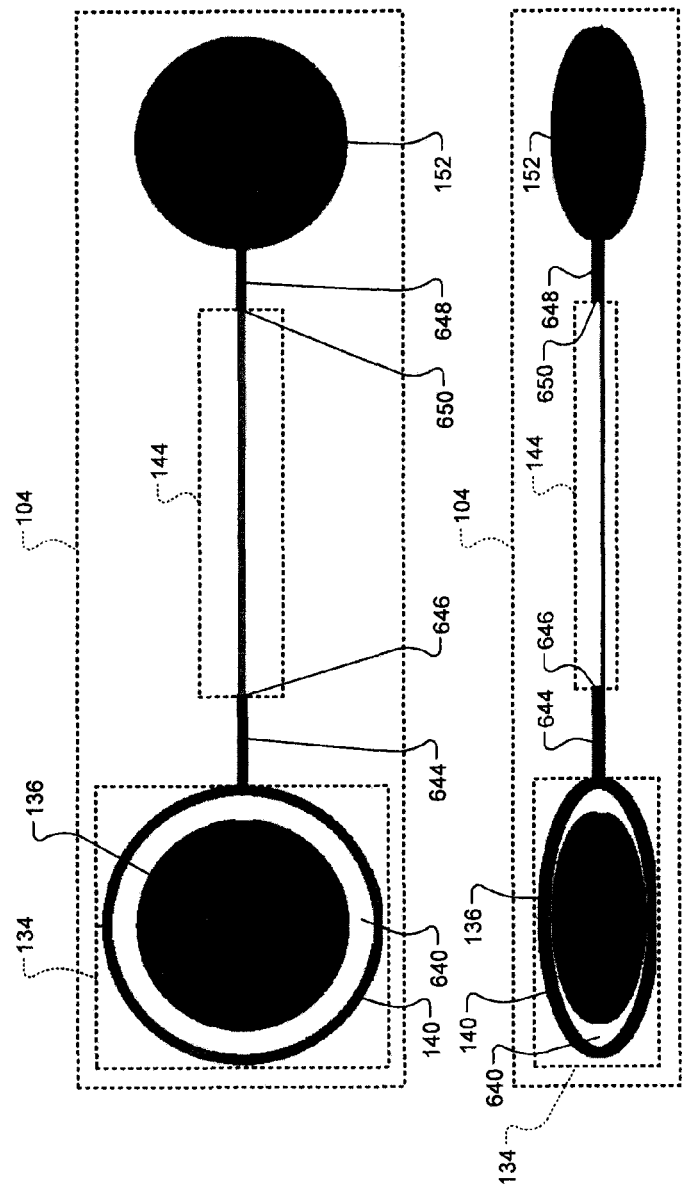

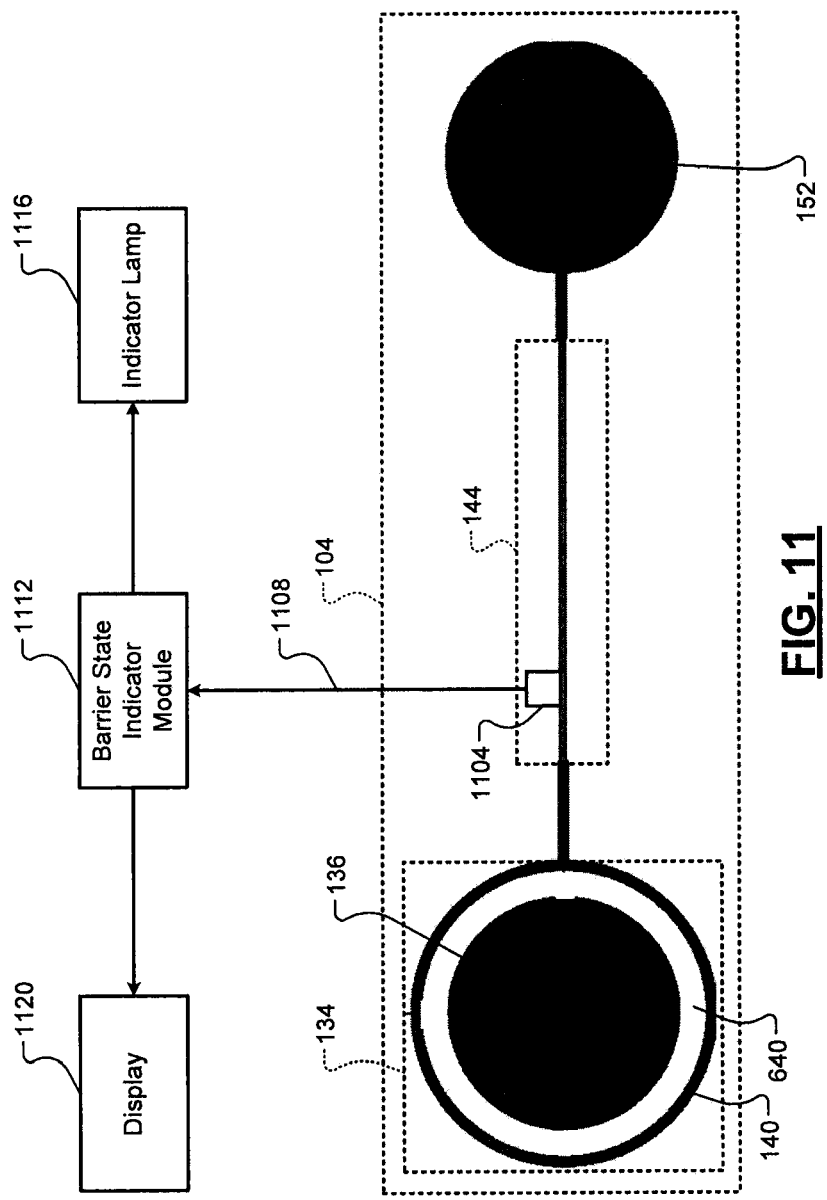

FAILSAFE GALVANIC ISOLATION BARRIER

FIELD

The present disclosure relates to isolation barriers and more particularly to isolation barriers with a fuse.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Galvanic isolation may refer to isolating different sections of an electrical circuit such that current does not flow from one section of the electrical circuit to another section of the electrical circuit. For example only, a transformer provides (inductive) galvanic isolation between a primary winding and a secondary winding. Other example types of galvanic isolation include capacitive galvanic isolation, optical galvanic isolation, etc.

Isolation barriers may be implemented for various reasons. For an example only, an isolation barrier may be implemented to permit different sections of an electrical circuit to operate at different reference potentials. For another example only, an isolation barrier may be implemented to protect electrical components from being subjected to voltage and/or current that is greater than a predetermined voltage rating and/or a predetermined current rating.

SUMMARY

A system includes a transmitter, a receiver, a isolation barrier, and a fuse. The isolation barrier is connected to the transmitter. The fuse is connected between the isolation barrier and the receiver. The isolation barrier prevents current flow from the transmitter to the receiver when a voltage across the isolation barrier is less than a first breakdown voltage. The isolation barrier short circuits when the voltage across the isolation barrier is greater than or equal to the first breakdown voltage. The fuse opens when the isolation barrier short circuits. When open, the fuse has a second breakdown voltage that is greater than the first breakdown voltage.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 6 is a cross-sectional view of an example integrated circuit (IC) including an isolation barrier according to the present disclosure;

FIG. 7 is an example top view of an isolation barrier according to the present disclosure;

FIG. 8 is an example side view of an isolation barrier according to the present disclosure;

FIG. 11 is a diagram of an example barrier state indication system according to the present disclosure.

DETAILED DESCRIPTION

Figure 1:
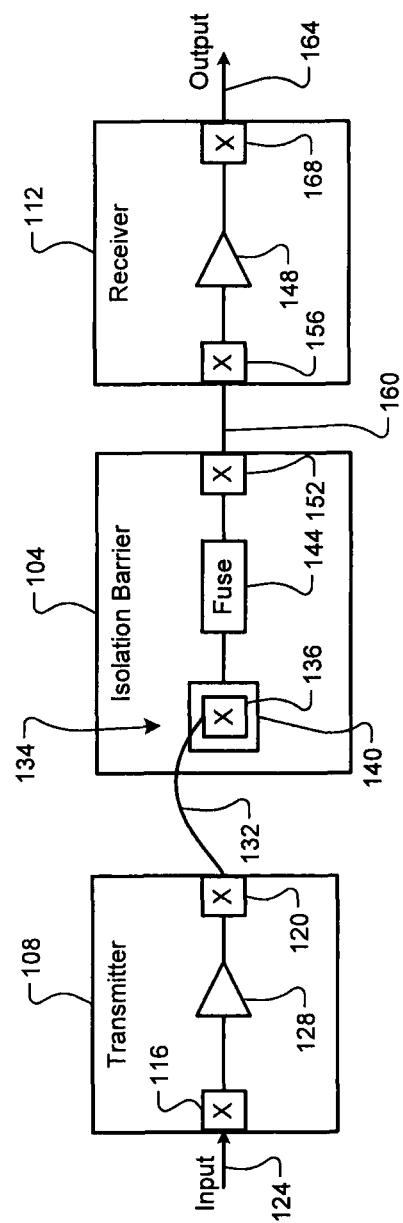
FIGS. 1-5 are diagrams of example systems including an isolation barrier according to the present disclosure.

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

A transmitter transmits data to a receiver via a primary isolation barrier. The primary isolation barrier electrically isolates the transmitter from the receiver. More specifically, the primary isolation barrier prevents current from flowing from the transmitter to the receiver. For example only, the primary isolation barrier may be a capacitive isolation barrier, an inductive isolation barrier, or another suitable type of non-optical isolation barrier.

The primary isolation barrier has a breakdown voltage. The primary isolation barrier may become short circuited when a voltage across the primary isolation barrier is greater than the breakdown voltage. When the voltage across the primary isolation barrier is greater than the breakdown voltage, insulating (isolating) material of the primary isolation barrier breaks down and conducts. The voltage across the primary isolation barrier may be greater than the breakdown voltage, for example, when a transient increase in a voltage output by the transmitter occurs. When short circuited, the primary isolation barrier provides a path for current to flow from the transmitter to the receiver and stops providing electrical isolation between the transmitter and the receiver.

An isolation barrier according to the present disclosure includes a primary isolation barrier that has a first breakdown voltage. The isolation barrier also includes a fuse that is connected in series with the primary isolation barrier. When a voltage across the primary isolation barrier is greater than the first breakdown voltage, the primary isolation barrier short circuits.

However, the fuse blows and creates an open-circuit when the primary isolation barrier shorts. The material resulting from the blowing of the fuse has a second breakdown voltage that is greater than the first breakdown voltage. By blowing and creating an open-circuit when the primary isolation barrier is short circuited, the fuse ensures that the transmitter and the receiver remain electrically isolated in the event that the voltage across the primary isolation barrier becomes greater than the first breakdown voltage.

Referring now to FIG. 1, a functional block diagram of an example system including an isolation barrier 104 is presented. The isolation barrier 104 provides electrical (galvanic) isolation between electrical components, such as a transmitter 108 and a receiver 112.

The transmitter 108 may include a transmitter input pad 116 and a transmitter output pad 120. The transmitter 108 may receive an input 124 via the transmitter input pad 116. The transmitter 108 may include one or more active and/or passive components 128, such as an amplifier, a driver, etc. The transmitter 108 outputs a voltage for the receiver 112 via the transmitter output pad 120. The transmitter 108 may selectively vary the voltage to transmit data to the receiver 112. The transmitter 108 generates the voltage based on a first reference potential.

A connector 132 may be connected between the transmitter output pad 120 and a primary isolation barrier 134. For example only, the primary isolation barrier 134 may include a capacitive isolation barrier, an inductive isolation barrier, a giant magneto resistive (GMR) isolation barrier, or another suitable non-optical isolation barrier. An input conductor 136 of the primary isolation barrier 134 is isolated from an output conductor 140 of the primary isolation barrier 134 by an insulating medium (see FIGS. 7-8). The insulating medium prevents current flow from the input conductor 136 to the output conductor 140 and vice versa.

The isolation barrier 104 also includes a fuse 144 that is connected in series with the primary isolation barrier 134 between the components 128 of the transmitter 108 and one or more components 148 of the receiver 112. For example only, the fuse 144 may be connected between the output conductor 140 and a barrier output pad 152. The barrier output pad 152 may be connected to a receiver input pad 156 via a second connector 160. The components 148 of the receiver 112 may include one or more active and/or passive components. The receiver 112 may provide output 164 via a receiver output pad 168. The receiver 112 may provide the output 164 based on a second reference potential that is different than the first reference potential.

The primary isolation barrier 134 has a first breakdown voltage. For example only, the first breakdown voltage may be approximately 2.5 kilo-Volts (kV) root mean squared (rms) or another suitable voltage. For another example only, the first breakdown voltage may be greater than approximately 1.0 kV rms. The primary isolation barrier 134 may be chosen such that the first breakdown voltage satisfies an Underwriters' Laboratory (UL) standard or another suitable standard for the system in which the primary isolation barrier 134 is implemented.

The voltage across the primary isolation barrier 134 may be greater than the first breakdown voltage under some circumstances. For example only, the voltage across the primary isolation barrier 134 may be greater than the first breakdown voltage when an increase in the voltage output by the transmitter 108 occurs. When the voltage across the primary isolation barrier 134 is greater than the first breakdown voltage, the insulating medium breaks down and becomes a conductor. The input and output conductors 136 and 140 may therefore be short circuited. Accordingly, the electrical isolation provided by the primary isolation barrier 134 may be eliminated when the voltage across the primary isolation barrier 134 is greater than the first breakdown voltage.

Without the fuse 144 connected in series with the primary isolation barrier 134, current could flow from the transmitter 108 to the receiver 112 when the primary isolation barrier 134 is short circuited. The fuse 144, however, blows when the voltage across the primary isolation barrier 134 is greater than the first breakdown voltage. More specifically, the fuse 144 blows when the primary isolation barrier 134 shorts.

When blown, the fuse 144 acts as an open-circuit. The fuse 144 may act as a resistor of at least a predetermined resistance when blown. For example only, the predetermined resistance may be approximately 1 gigaohm (GΩ) or another suitable resistance.

A second breakdown voltage of the blown fuse 144 is greater than the first breakdown voltage of the primary isolation barrier 134. For example only, if the first breakdown voltage of the primary isolation barrier 134 is approximately 2.5 kV rms, the second breakdown voltage may be approximately 10.0 kV rms or another suitable voltage that is greater than the first breakdown voltage. The fuse 144 may be configured such that the second breakdown voltage is 1.5 times the first breakdown voltage, 2 times the first breakdown voltage, 3 times the first breakdown voltage, 4 times the first breakdown voltage, or another suitable amount greater than the first breakdown voltage. The fuse 144 ensures that the transmitter 108 and the receiver 112 will be electrically isolated at voltages up to the second breakdown voltage when the primary isolation barrier 134 will be shorted.

Figure 2:
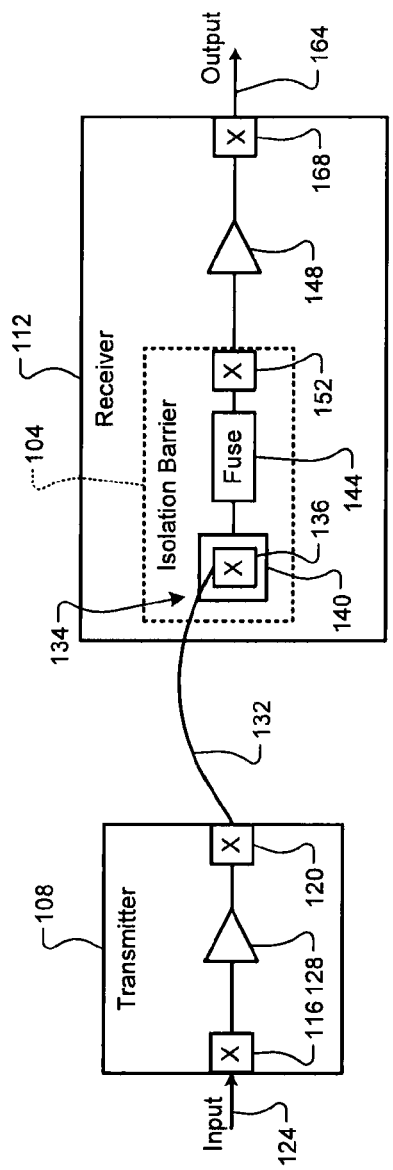
Figure 3:
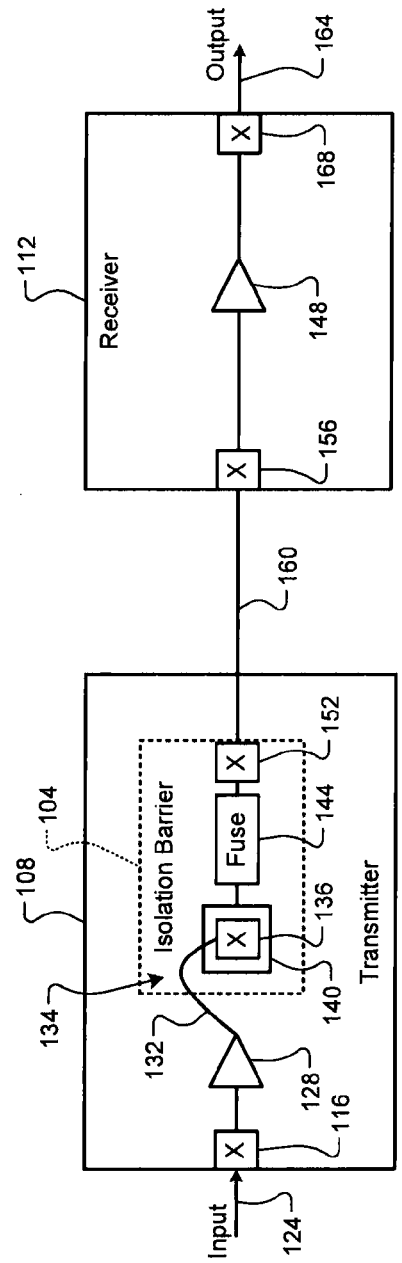

Referring now to FIGS. 2-3, functional block diagrams of other example systems including the isolation barrier 104 are presented. While the isolation barrier 104, the transmitter 108, and the receiver 112 are shown in FIG. 1 as being implemented on separate chips, the isolation barrier 104 and the receiver 112 may be integrated on one chip as illustrated in FIG. 2. The isolation barrier 104 and the transmitter 108 may alternatively be integrated on one chip as illustrated in FIG. 3.

Figure 4:
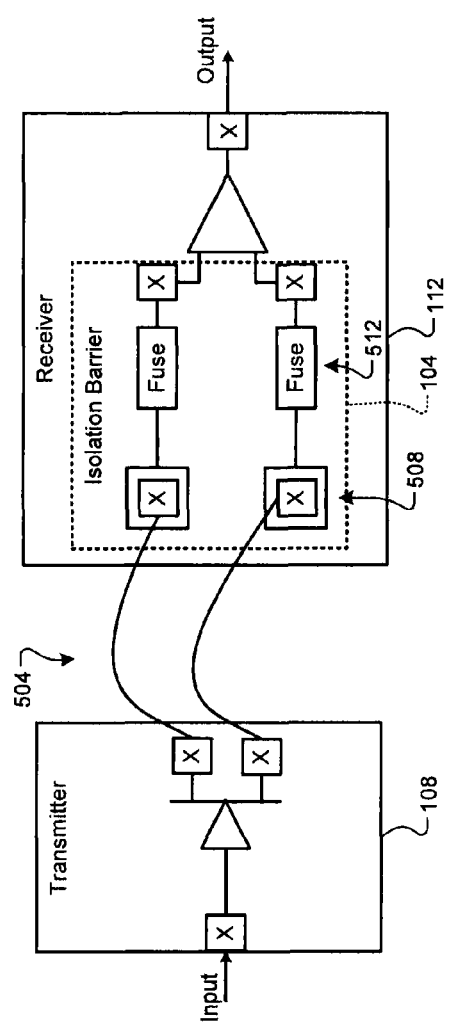
Figure 5:
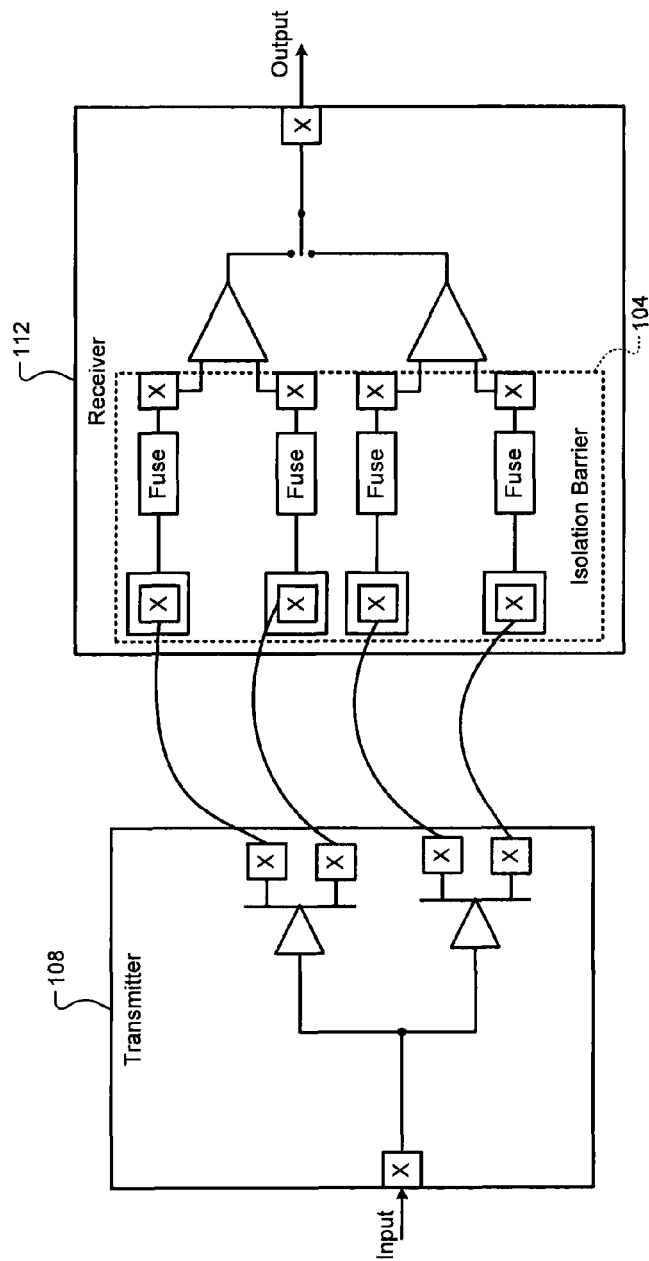
Figure 10:
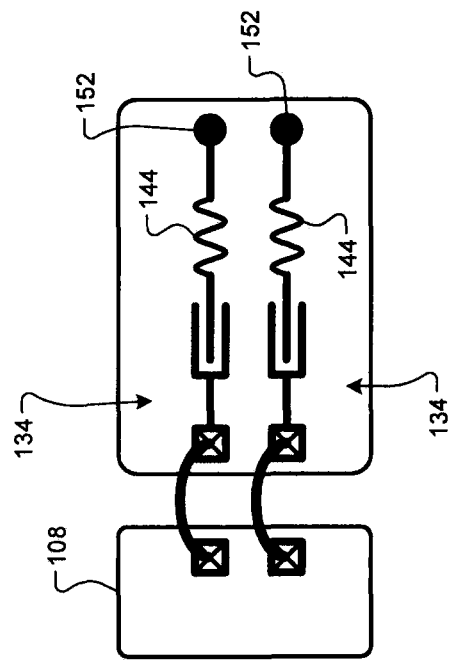
FIG. 10 is a diagram of another example system including an isolation barrier according to the present disclosure.

Referring now to FIGS. 4, 5, and 10, functional block diagrams of other example systems including the isolation barrier 104 are presented. The transmitter 108 may output data for the receiver 112 via N conductors 504, where N is an integer greater than zero. In the examples of FIGS. 1, 4, 5, and 10, N is equal to 1, 2, 4, and 2 respectively. The isolation barrier 104 may include N primary isolation barriers 508; one primary isolation barrier for each of the N conductors 504. The isolation barrier 104 may include N fuses 512; one fuse connected in series with each of the N primary isolation barriers 508.

Referring now to FIG. 6, an example cross-sectional view of a chip 604 including the isolation barrier 104, the transmitter 108, and the receiver 112 is presented. A substrate 608 may be implemented on a package frame 612. For example only, the substrate 608 may be a quartz substrate, a silicon dioxide ($SiO_2$) substrate, or another suitable type of substrate. The transmitter 108 may receive the input 124 via an external input pin 616. The receiver 112 may provide the output 164 to an external output pin 620.

The isolation barrier 104 may be implemented on top of the substrate 608. The transmitter 108 and the receiver 112 may be implemented on separate substrates on top of the isolation barrier 104 in various implementations. One or more conductors (not shown) may be deposited on top of the substrate 608. The chip 604 may include a molding compound that is generally illustrated by 632.

FIGS. 7 and 8 include top and side-angle views of an example implementation of the isolation barrier 104 where the primary isolation barrier 134 is a capacitive isolation barrier. Referring now to FIGS. 6-8, the transmitter 108 and the receiver 112 may be connected to the isolation barrier 104 via bond wires 636. The transmitter 108 may be connected to the input conductor 136 of the primary isolation barrier 134 through one of the bond wires 636. The receiver 112 may be connected to a conductive pad, such as the barrier output pad 152, through one of the bond wires 636.

A dielectric material 640 or another suitable insulating material is included between the input conductor 136 of the primary isolation barrier 134 and the output conductor 140 of the primary isolation barrier 134. The dielectric material 640 prevents current flow from the input conductor 136 to the output conductor 140 and vice versa. A first conductive lead 644 is connected between the output conductor 140 and a first terminal 646 of the fuse 144. A second conductive lead 648 may be connected between the barrier output pad 152 and a second terminal 650 of the fuse 144.

The voltage at the input conductor 136 may be approximately equal to the voltage output by the transmitter 108. When the fuse 144 is intact (non-blown), the voltage at the output conductor 140 may be approximately equal to the voltage at the barrier output pad 152. A portion of the dielectric material 640 may break down and become a conductor when the voltage across the input and output conductors 136 and 140 is greater than the first breakdown voltage. In other words, the dielectric material 640 may create a short-circuit between the input conductor 136 and the output conductor 140 when the voltage across the input and output conductors 136 and 140 is greater than the first breakdown voltage.

The fuse 144 includes a conductive material. For example only, the conductive material may include or consist of nickel chromium, chromium silicon, polysilicon, or another suitable conductive material. The fuse 144 may be formed, for example, using thin film deposition or in another suitable manner. In other words, the fuse 144 may be a thin film resistor. When in its non-blown state, the fuse 144 has approximately a first resistance. For example only, the first resistance may be between 1 ohm (Ω) and 10 kΩ or another suitable resistance.

When the input and output conductors 136 and 140 are short-circuited, current that is greater than a predetermined current flows from the first terminal 646 to the second terminal 650. Current greater than the predetermined current may cause the fuse 144 to blow. More specifically, the conductive material of the fuse 144 evaporates (e.g., oxidizes) when the current is greater than the predetermined current. The conductive material of the fuse 144 and the dimensions of the fuse 144 may be configured to minimize the amount of residual conductive plasma that is present after the conductive material evaporates. The conductive material of the fuse 144 and the dimensions of the fuse 144 may be configured such that the predetermined current corresponds to the first breakdown voltage.

Figure 9:
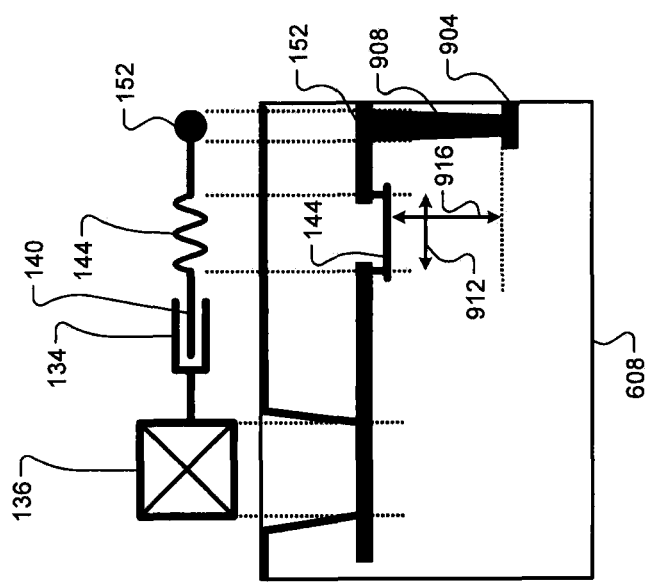
FIG. 9 is an example diagram and a schematic of an isolation barrier according to the present disclosure.

FIG. 9 is another example illustration of an example implementation of the isolation barrier 104 where the primary isolation barrier 134 is a capacitive isolation barrier. Referring now to FIGS. 6-9, the barrier output pad 152 may be connected to a conductor layer 904 through a conductive via 908. A voltage of the conductor layer 904 may be a reference potential, such as one of the first and second reference potentials or a third, different reference potential.

A distance 912 between the first terminal 646 and the second terminal 650 may be configured such that at least a first predetermined distance (and at least the second breakdown voltage) is present when the fuse 144 is open. A distance 916 between the first terminal 646 and a conductor that is at the same reference potential as the second terminal 650 (e.g., the conductor layer 904) may also be configured such that at least a second predetermined distance (and a third breakdown voltage that is greater than or equal to the second breakdown voltage) is present when the fuse 144 is open. The predetermined resistance may correspond to a resistance necessary to achieve electrical isolation at voltages that are less than the second breakdown voltage.

Referring now to FIG. 11, a diagram of an example barrier state indication system is presented. A current sensor 1104 may be implemented in various implementations. The current sensor 1104 measures current flowing through the fuse 144 and generates a signal 1108 based on the current flowing through the fuse 144.

A barrier monitoring module 1112 determines an amount of current flowing through the fuse 144 based on the signal 1108. The barrier monitoring module 1112 monitors the amount of current and may indicate a state of the isolation barrier 104 based on the amount of current. For example only, the barrier monitoring module 1112 may indicate that the isolation barrier 104 is in a non-functional state when the amount of current is approximately zero. The non-functional state may indicate that the primary isolation barrier 134 is shorted and that the fuse 144 is blown.

The barrier monitoring module 1112 may indicate that the isolation barrier 104 is in the non-functional state, for example, by illuminating an indicator lamp 1116, generating a message on a display 1120, and/or in another suitable manner. An indication that the isolation barrier 104 is in the non-functional state may indicate the chip of the isolation barrier 104 should be replaced.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system comprising:
a transmitter that is implemented on a first integrated circuit;
a receiver that is implemented on a second integrated circuit;
an isolation barrier that is connected to the transmitter and that is implemented on a third integrated circuit,
wherein the first, second, and third integrated circuits are different;
a fuse that includes a conductive material, that is connected between the isolation barrier and the receiver, and that is implemented on the third integrated circuit;
a current sensor that measures current flow through the fuse;
an indicator lamp; and
a barrier monitoring module that illuminates the indicator lamp when the current is approximately zero, wherein:
the isolation barrier prevents current flow from the transmitter to the receiver when a voltage across the isolation barrier is less than a first breakdown voltage,
the isolation barrier short circuits when the voltage across the isolation barrier is greater than or equal to the first breakdown voltage,
the conductive material of the fuse oxidizes and opens the fuse when the isolation barrier short circuits, and
when open, the fuse has a second breakdown voltage that is greater than the first breakdown voltage.

2. The system of claim 1 wherein the first breakdown voltage is greater than 1 kilo-Volt (kV).

3. The system of claim 1 wherein the second breakdown voltage is at least double the first breakdown voltage.

4. The system of claim 1 wherein the fuse includes a first resistance before the conductive material oxidizes and a second resistance after the conductive material oxidizes, and
wherein the first resistance is less than the second resistance.

5. The system of claim 4 wherein the first resistance is between 1 ohm and 10 kilohms.

6. The system of claim 4 wherein the second resistance is at least double the first resistance.

7. The system of claim 1 wherein the fuse includes a thin film resistor.

8. The system of claim 1 wherein the isolation barrier includes a capacitive isolation barrier.

9. The system of claim 1 wherein the isolation barrier includes an inductive isolation barrier.

10. The system of claim 1 wherein the isolation barrier includes a giant magnetoresistive (GMR) isolation barrier.

11. The system of claim 1 wherein the fuse includes polysilicon.

12. The system of claim 1 wherein the fuse includes nickel chromium.

13. The system of claim 1 wherein the fuse includes chromium silicon.

* * * * *

UNITED STATES PATENT AND TRADEMARK OFFICE
CERTIFICATE OF CORRECTION

| | | |
|---|---|---|
| PATENT NO. | : 8,625,242 B2 | Page 1 of 1 |
| APPLICATION NO. | : 13/197136 | |
| DATED | : January 7, 2014 | |
| INVENTOR(S) | : Roberto Alini et al. | |

It is certified that error appears in the above-identified patent and that said Letters Patent is hereby corrected as shown below:

In the Specification:

Column 2, Line 16    Delete "logical or" and insert --logical OR--

Signed and Sealed this
Twenty-seventh Day of May, 2014

Michelle K. Lee
*Deputy Director of the United States Patent and Trademark Office*